United States Patent [19]
Yamamoto et al.

[11] Patent Number: 5,661,837
[45] Date of Patent: Aug. 26, 1997

[54] ILLUMINATION OPTICAL APPARATUS AND SCANNING EXPOSURE APPARATUS USING THE SAME

[75] Inventors: Noriaki Yamamoto, Kitakatsushika-gun; Tetsuo Kikuchi, Tokyo, both of Japan

[73] Assignee: Nikon Corporation, Japan

[21] Appl. No.: 629,919

[22] Filed: Apr. 9, 1996

Related U.S. Application Data

[63] Continuation of Ser. No. 495,245, Jun. 27, 1995, abandoned.

[30] Foreign Application Priority Data

Jun. 29, 1994 [JP] Japan .................. 6-170087

[51] Int. Cl.$^6$ .................................................. G02B 6/06
[52] U.S. Cl. .................. 385/115; 385/121; 385/119; 385/901; 385/33
[58] Field of Search .................... 385/115–121, 901, 385/33

[56] References Cited

U.S. PATENT DOCUMENTS

| | | | |
|---|---|---|---|
| 4,844,568 | 7/1989 | Suzuki et al. | 350/6.2 |
| 4,932,747 | 6/1990 | Russell et al. | 350/96.24 |
| 5,408,572 | 4/1995 | Kriege | 385/901 |
| 5,430,816 | 7/1995 | Furuya et al. | 385/115 |
| 5,491,765 | 2/1996 | Matsumoto | 385/33 |

FOREIGN PATENT DOCUMENTS

| | | | |
|---|---|---|---|
| 62-17630A | 1/1987 | Japan . | |
| 62-17705A | 1/1987 | Japan . | |
| 3-171005 | 7/1991 | Japan | 385/115 |
| 2041187 | 9/1980 | United Kingdom | 385/115 |

*Primary Examiner*—John Ngo
*Attorney, Agent, or Firm*—Pennie & Edmonds LLP

[57] ABSTRACT

An illumination optical apparatus of this invention is small in size as a whole and capable of illuminating a plurality of illumination areas on a mask. The illumination optical apparatus illuminates a plurality of areas on a mask to be projected/exposed. This apparatus includes at least two light sources, a focusing optical system for focusing light beams from the respective light sources to form light source images, a light guide having incident ends equal in number to the light sources and exit ends equal in number to the illumination areas and serving to guide light beams from the respective light source images incident on the incident ends to the exit ends, and an illumination optical system for irradiating the light beams from the respective light source images emerging from the exit ends of the light guide onto the corresponding areas on the mask. The light guide is constituted by a plurality of optical fibers bundled together and divides light beams to make the amounts of light beams at the respective exit ends almost equal to each other.

13 Claims, 6 Drawing Sheets

ILLUMINATION OPTICAL APPARATUS AND SCANNING EXPOSURE APPARATUS USING THE SAME

This is a continuation of application Ser. No. 08/495,245, filed Jun. 27, 1995, now abandoned.

BACKGROUND OF THE INVENTION

1. Field of the Invention

The present invention relates to an illumination optical system used in an exposure apparatus for manufacturing semiconductor and liquid crystal display substrates to illuminate a plurality of areas on a mask, and a scanning exposure apparatus using the illumination optical system.

2. Related Background Art

Figure 1:
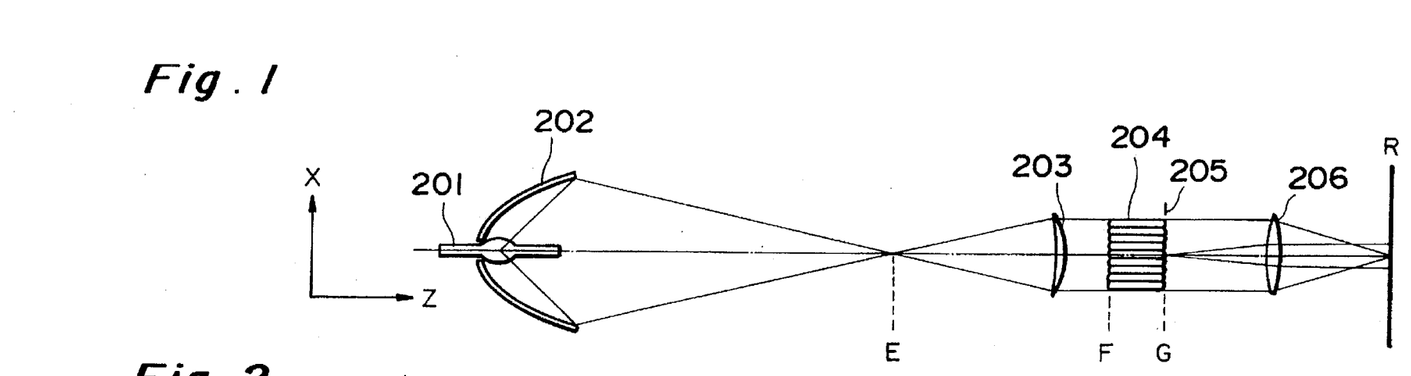
FIG. 1 is a sectional view taken along the X-Z plane to show the arrangement of a conventional illumination optical apparatus.
Figure 2:
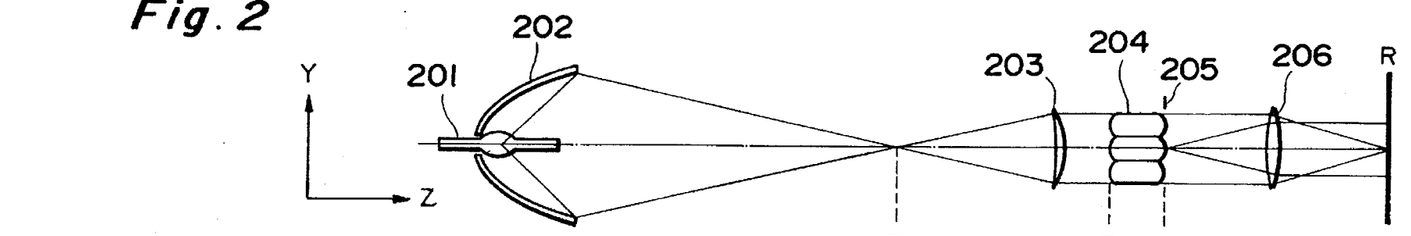
FIG. 2 is a sectional view taken along the Y-Z plane of the illumination optical apparatus shown in FIG. 1.

FIGS. 1 and 2 show the arrangement of a conventional illumination optical apparatus. FIGS. 1 and 2 are sectional views respectively taken along the X-Z plane and the Y-Z plane in the X-Y-Z orthogonal coordinate system having an optical axis as the Z-axis.

The illumination optical apparatus shown in FIGS. 1 and 2 includes a light source 201 such as a mercury-arc lamp. The light source 201 is positioned at the first focal position of an elliptical mirror 202. A light beam emitted from the light source 201 is focused by the elliptical mirror 202 to form a light source image at a second focal position E of the elliptical mirror 202.

Figure 3:
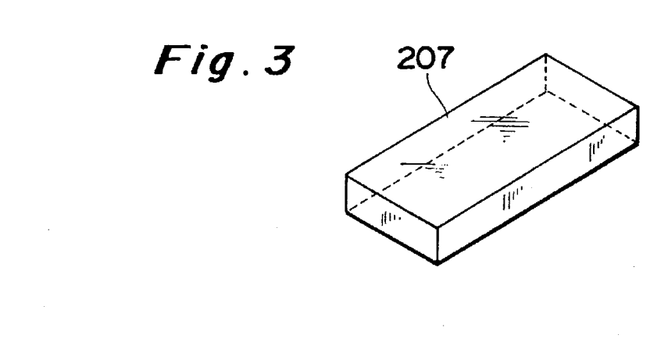
FIG. 3 is a perspective view showing a lens element used in an optical integrator of the illumination optical apparatus in FIGS. 1 and 2.

A light beam from this light source image is incident on a collimation lens 203 to be collimated. Thereafter, the parallel light beam is incident on an optical integrator 204 as a multiple light source forming means (this incident plane is indicated by "F"). As shown in FIG. 3, a lens element 207 constituting the optical integrator 204 has a rectangular cross-section almost similar to the shape of an illumination area. As shown in FIGS. 1 and 2, the optical integrator 204 is constituted by a plurality of lens elements 207 arranged vertically and horizontally to have an almost square cross-section as a whole.

The parallel light beam incident on the optical integrator 204 is focused to form a plurality of light source images at an exit plane G of the optical integrator 204. Light beams from these light source images are incident on a condenser lens 206 via an aperture stop 205 positioned immediately behind the exit plane G. The light beams from the light source images uniformly illuminate a rectangular illumination area on a mask surface R in a superposed state.

SUMMARY OF THE INVENTION

An illumination optical apparatus of the present invention illuminates a plurality of areas on a mask to be projected/exposed. This apparatus includes at least two light sources, a focusing optical system for focusing light beams from the respective light sources to form light source images, a light guide means having incident ends equal in number to the light sources and exit ends equal in number to the illumination areas and serving to guide light beams from the respective light source images incident on the incident ends to the exit ends, and an illumination optical system for irradiating the light beams from the respective light source images emerging from the exit ends of the light guide means onto the corresponding areas on the mask. The light guide means is constituted by a plurality of optical fibers bundled together and divides light beams to make the amounts of light beams at the respective exit ends almost equal to each other.

According to a preferred aspect of the present invention, the light guide means is constituted by a plurality of optical fibers bundled together. The optical fibers are branched such that the numbers of optical fibers at the respective exit ends become equal to each other, and the number of optical fibers at each incident end is proportional to the output of a corresponding one of the light sources.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

Recently, with the use of larger masks, a so-called scanning exposure apparatus has been proposed. In this apparatus, while a plurality of areas on a mask, which extend in a predetermined direction, are illuminated, the mask and a photosensitive substrate are scanned with respect to a projection optical system in a direction perpendicular to the predetermined direction, thereby exposing patterns formed on the mask onto the photosensitive substrate altogether.

When the conventional illumination optical apparatus shown in FIGS. 1 and 2 is to be applied to the above scanning exposure apparatus, illumination optical apparatuses equal in number to illumination areas must be arranged. That is, light sources equal in number to the illumination areas are required.

Consequently, the overall apparatus becomes very large in size. Especially when illumination areas are arranged to be adjacent to each other with small spaces therebetween, it is difficult to arrange light sources and elliptical mirrors.

Assume that conventional illumination optical apparatuses equal in number to illumination areas are arranged. In this case, if some trouble occurs in a light source, e.g., one of the light sources fails, the exposure apparatus malfunctions.

A light amount loss can be effectively prevented if each lens element of an optical integrator has a rectangular cross-section similar to an illumination area, and the incident end face of each lens element is conjugate to a mask surface. However, since a light source image formed at the exit end of each lens element is not rectangular but almost circular, a light amount loss occurs at the exist end of each lens element.

In an illumination optical apparatus of the present invention, a light beam from each light source is focused by a corresponding elliptical mirror as a focusing means to form an image of each light source. Thereafter, a light beam of each light source image is incident on a corresponding incident end of a light guide means having incident ends equal in number to the light sources. The light guide means is constituted by a plurality of optical fibers bundled together. The light guide serves to guide incident light beams from the respective light source images to the exit ends equal in number to the illumination areas. Note that the plurality of optical fibers are properly branched to the respective incident and exit terminals to make the light amounts at the respective exit ends of the light guide means almost equal to each other. A light beam from each exit end of the light guide means is irradiated on a corresponding illumination area via an illumination optical system.

As described above, in the illumination optical apparatus of the present invention, light from light sources can be divided into a required number of light source images. For this reason, a required number of illumination areas can be illuminated by a small number of light sources. Consequently, the number of light sources can be decreased, and hence the overall apparatus can be reduced in size. In addition, light sources and elliptical mirrors can be easily arranged regardless of the number of illumination areas and the spaces therebetween.

Note that if a light amount shortage occurs, and light sources can be arranged, the number of light sources can be increased in contrast to the above case.

It is preferable that the light guide means be constituted by a plurality of optical fibers randomly bundled together. It is also preferable that the bundle of optical fibers be properly branched to make the number of optical fibers at each incident end proportional to the output of a corresponding light source, and the bundle of optical fibers be branched to make the numbers of optical fibers at the respective exit ends equal to each other.

In this case, the light amounts of light beams emerging from the respective exit ends of the light guide means become almost equal to each other independently of variations in outputs of the respective light sources. Therefore, this arrangement is advantageous in making irradiances in the respective illumination areas uniform.

Light beams from the respective exit ends of the light guide means are collimated first by the corresponding collimation lenses, and are then incident on a plurality of optical integrators as a multiple light source forming means. As a result, a plurality of light source images (images on the exit planes of the light guide means) are formed on the exit planes of the respective optical integrators.

As described above, since the incident plane of each lens element of this optical integrator is conjugate to the mask surface, a light amount loss can be prevented by making the cross-section of each lens element have a rectangular shape similar to the shape of an illumination area. Note that in this specification, a "rectangular shape" means almost a rectangle as a whole and is a concept including all shapes similar to rectangles, such as trapezoids.

An improvement in light amount efficiency can be attained by making the cross-sectional shape of each incident end of the light guide means almost circular (the shape of a light source image) and also making the cross-sectional shape of each exit end of the light guide means similar to the cross-sectional shape of each lens element of each optical integrator, i.e., shaping the cross-section of each exit end into a rectangular shape similar to the shape of an illumination area.

Light beams from the plurality of light source images formed on the respective exit planes of the optical integrators can uniformly illuminate the respective illumination areas on the mask surface in a superposed state via the respective condenser lenses without causing any light amount loss.

First Embodiment

The first embodiment of the present invention will be described below with reference to the accompanying drawings.

Figure 4:
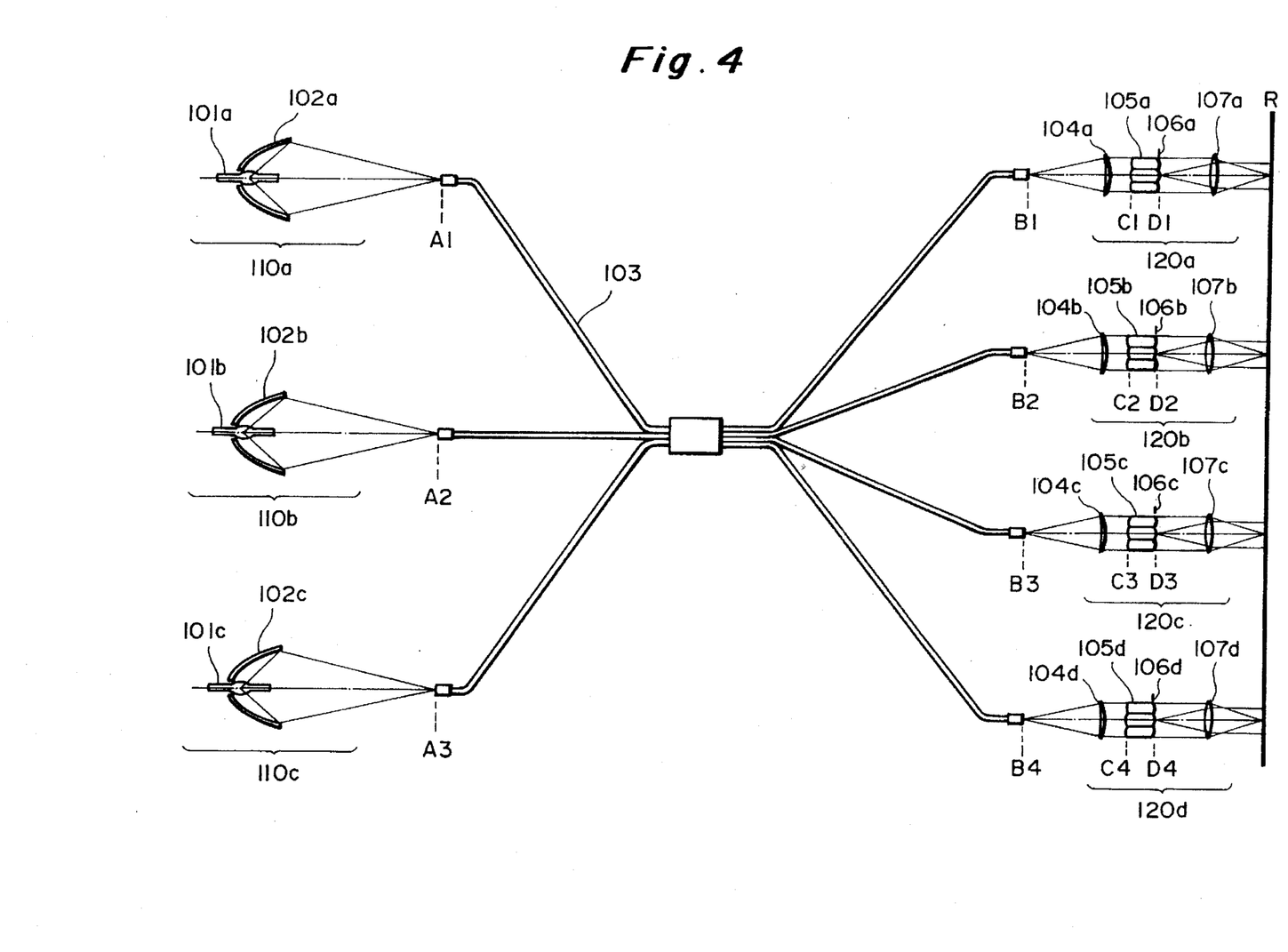
FIG. 4 is a sectional view for explaining the arrangement of an illumination optical apparatus according to the first embodiment of the present invention.
Figure 5:
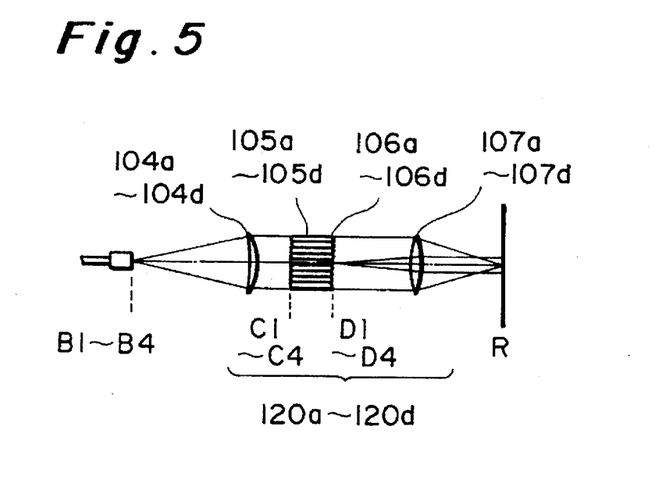
FIG. 5 is a side view showing an optical system after a light guide in the illumination optical apparatus shown in FIG. 4.
Figure 6:
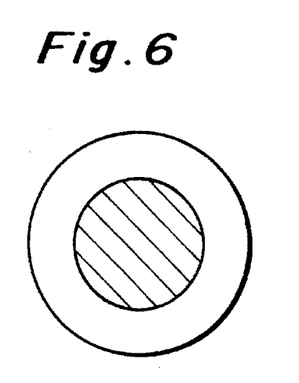
FIG. 6 is a sectional view of an incident end of the light guide of the illumination optical apparatus shown in FIG. 4.
Figure 7:
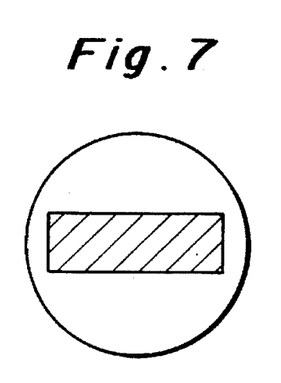
FIG. 7 is a sectional view of an exit end of the light guide of the illumination optical apparatus shown in FIG. 4.
Figure 8:
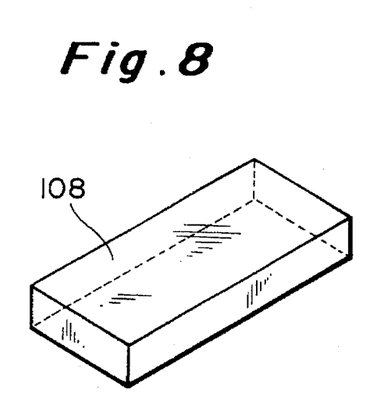
FIG. 8 is a perspective view showing a lens element used in an optical integrator of the illumination optical apparatus in FIG. 4.

FIG. 4 is a sectional view for explaining the arrangement of an illumination optical apparatus according to the first embodiment of the present invention. FIG. 5 is a side view of an illumination optical system after a light guide 103. FIG. 6 is a sectional view of each incident end of the light guide 103 in FIG. 4. FIG. 7 is a sectional view of each exit end of the light guide 103 in FIG. 4. FIG. 8 is a perspective view showing each lens element of an optical integrator 105 in FIG. 4.

The illumination optical apparatus shown in FIG. 4 includes, for example, three light supply means 110a to 110c. The number of light supply means is not limited to three, and the respective means need not have the same arrangement. In this embodiment, however, the respective light supply means have the same arrangement. For this reason, the arrangement of only the light supply means 110a will be described below, and a repetitive description of the remaining light supply means 110b and 110c will be omitted.

The light supply means 110a comprises an elliptical mirror 102a as a focusing means, and a light source 101a arranged at the first focal position of the elliptical mirror 102a. The light source 101a is a light source such as a mercury-arc lamp for outputting an emission line such as a g-, h-, or i-ray.

A light beam emitted from the light source 101a is focused by the elliptical mirror 102a to form a light source image at a second focal position A1 of the elliptical mirror 102a. Similarly, the light supply means 110b and 110c respectively form light source images at positions A2 and A3.

Light beams from the light source images formed at the positions A1 to A3 are incident on the respective incident ends of the light guide 103 which are respectively positioned to the positions A1 to A3. The light guide 103 is constituted by a plurality of optical fibers randomly bundled together. The light guide 103 has incident ends equal in number to the number of light sources (three in this embodiment), and exit ends equal in number to the number of illumination areas (four in this embodiment). The plurality of optical fibers constituting the light guide 103 are equally branched at the respective incident ends and the respective exit ends. Each incident end has a circular shape almost similar to the shape of a light source image, as shown in FIG. 6, whereas each exit end has a rectangular shape almost similar to the shape of an illumination area, as shown in FIG. 7.

The light beams from the respective light source images formed at the positions A1 to A3 are respectively incident on the corresponding incident ends of the light guide 103 to be randomly mixed with each other. The resultant light is equally divided to emerge from the respective exit ends.

Four illumination optical systems 120a to 120d having the same arrangement are arranged parallelly after positions B1 to B4 of the respective exit ends of the light guide 103. Therefore, the arrangement of only the illumination optical system 120a will be described below, and a repetitive description of the remaining illumination optical systems 120b to 120d will be omitted.

A light beam from the exit end positioned to the position B1, of the four exit ends of the light guide 103, is incident on a collimation lens 104a of the illumination optical system 120a. The light passing through the collimation lens 104a is collimated and incident on an optical integrator 105a as a multiple light source forming means (the incident plane is indicated by "C1").

As shown in FIG. 8, a lens element 108 constituting the optical integrator 105a has a cross-sectional shape almost similar to the shape (rectangular shape) of a corresponding illumination area. As shown in FIGS. 5 and 4, the optical integrator 105a is constituted by a plurality of lens elements 108 arranged vertically and horizontally to have an almost square cross-sectional area as a whole.

A light beam incident on the optical integrator 105a is focused to form a plurality of light source images (images on the exit end of the light guide 103 which is located at the position B1) at an exit end D1 of the optical integrator 105a.

The plurality of light source images formed at the exit end D1 of the optical integrator 105a are shaped into circular images by a circular aperture stop 106a arranged immediately after the exit end D1. Light beams from the plurality of circular light source images pass through a condenser lens 107a to uniformly illuminate a corresponding rectangular area on a mask surface R in a superposed state.

Similarly, light beams from the remaining exit ends of the light guide 103 which are respectively located at the positions B2 to B4 uniformly illuminate other corresponding rectangular areas in a superposed state.

As described above, the cross-sectional shape of each exit end of the light guide 103 is made to be almost similar to the shape of an illumination area, i.e., the cross-sectional shape of each lens element 108 constituting the optical integrator. With this arrangement, a light amount loss at each of the exit ends D1 to D4 of the optical integrators 105a to 105d can be prevented.

As described above, according to the illumination optical apparatus of this embodiment, light beams from a plurality of light supply means are equally divided into a required number of light source images through the light guide constituted by optical fibers randomly bundled together, and the resultant light beams are guided to the subsequent illumination optical systems. Therefore, irradiances in the respective illumination areas can be made equal independently of variations in outputs of the respective light sources.

Since the number of light sources need not be equal to the number of illumination areas, light sources and elliptical mirrors can be easily arranged by decreasing the number of light sources. In addition, power can be saved.

In addition, since the incident plane of each optical integrator as a multiple light source forming means is conjugate to a mask surface, uniform illumination can be realized without any light amount loss by making the cross-sectional shape of each lens element of the optical integrator similar to the shape of an illumination area.

Furthermore, if each exit end of the light guide is shaped into a rectangular shape similar to the shape of an illumination area, a light source image formed at each exit end of the optical integrator also has a rectangular shape similar to the cross-sectional shape of each lens element. Therefore, a light amount loss in the optical integrator can be suppressed.

Figure 9:
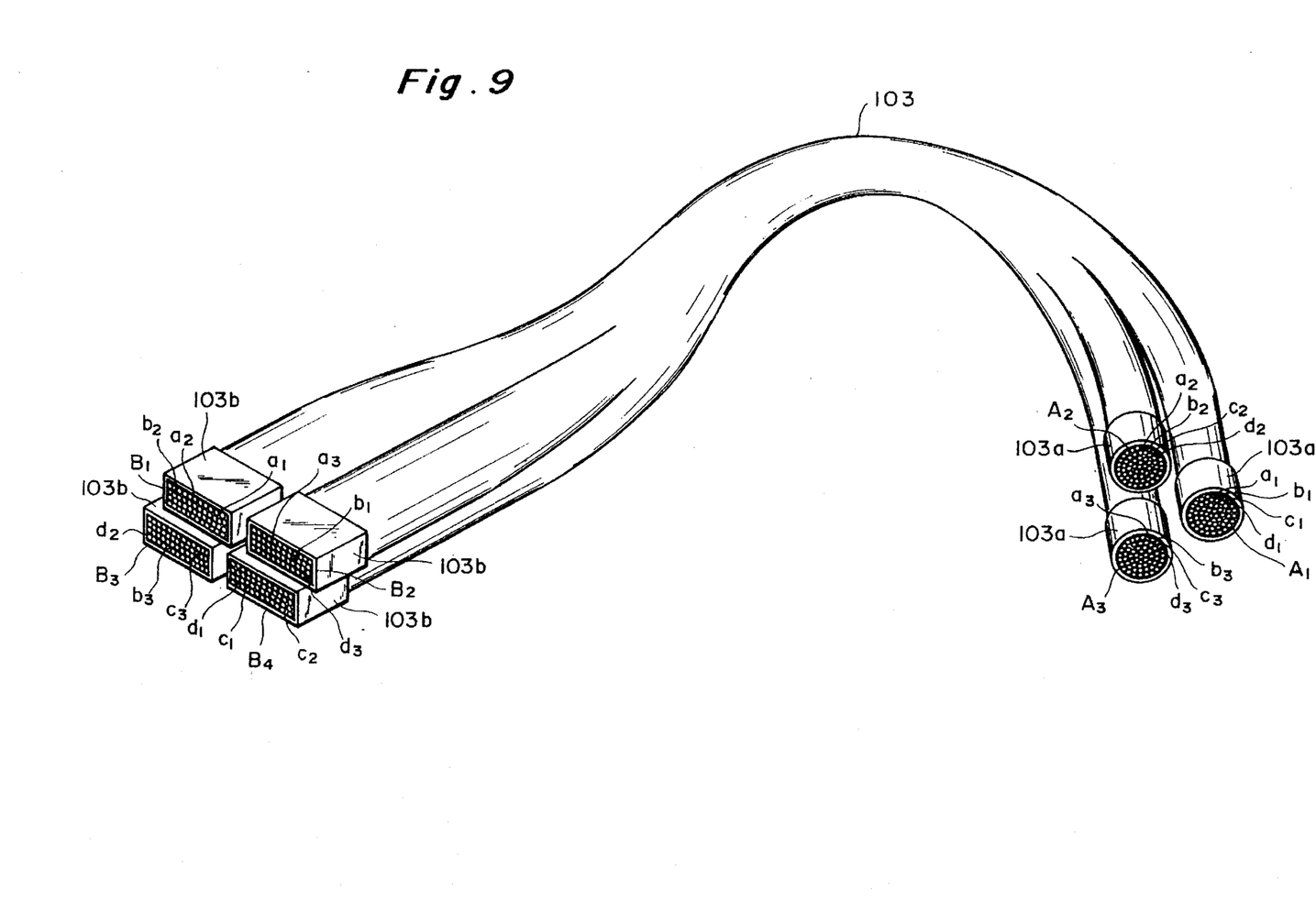
FIG. 9 is a perspective view showing the detailed arrangement of the light guide.

The arrangement of the light guide 103 will be described in detail next.

As shown in FIG. 9, the light guide 103 is formed by bundling a large number of optical fibers such that the arrangement of the optical fibers at end faces (incident ends) $A_1$ to $A_3$ on one side is different from that at end faces (exit ends) $B_1$ to $B_4$ on the other side. That is, the optical fibers are twisted to have an irregular arrangement. If, for example, the number of optical fibers at each of the end faces $A_1$ to $A_3$ is 6,000, the number of optical fibers at each of the end faces $B_1$ to $B_4$ is 4,500. In this case, end portions 103a and 103b are fixed with, e.g., a resin to prevent the end faces $A_1$ to $A_3$ and $B_1$ to $B_4$ of the light guide 103 from being loosened.

Assume that adjacent optical fibers, of the optical fibers belonging to the end faces $A_1$ to $A_3$, are respectively denoted by reference symbols $a_1$ to $d_1$, $a_2$ to $d_2$, and $a_3$ to $d_3$. In this case, these optical fibers are randomly arranged at the end faces $B_1$ to $B_4$, as shown in FIG. 9. Even if, therefore, light beams incident on the end faces $A_1$ to $A_3$ on the incident side exhibit a nonuniform light amount distribution, light beams emerging from the end faces $B_1$ to $B_4$ on the exit side exhibit a uniform light amount distribution.

Figures 10, 11:
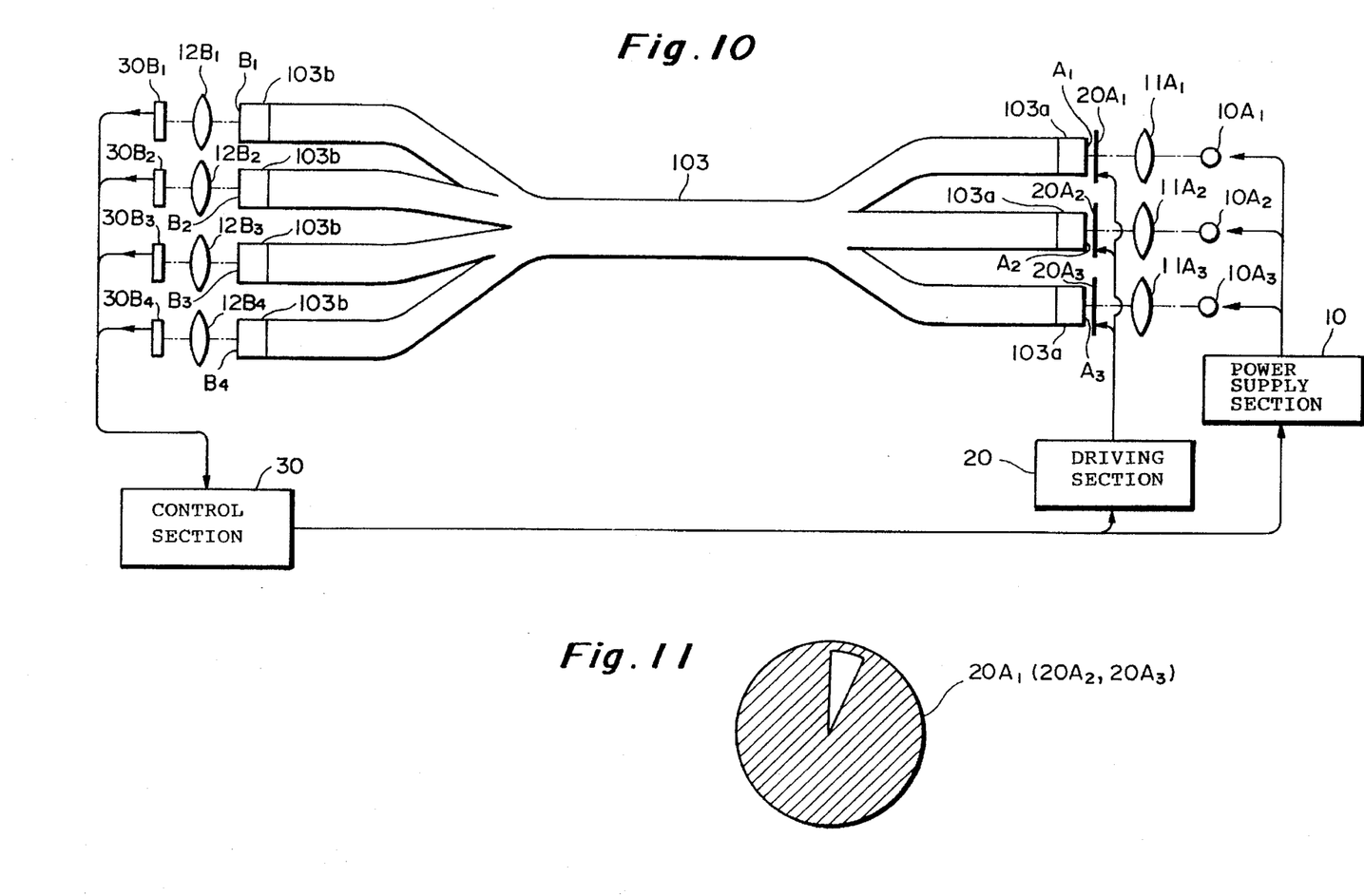
FIG. 10 is a view for explaining a method of inspecting the light guide.
FIG. 11 is a view showing the arrangement of a stop plate.

A method of inspecting the light guide 103, which is applied to this embodiment, will be described next with reference to FIG. 10. Referring to FIG. 10, light sources $10A_1$ to $10A_3$ are respectively turned on by currents supplied from a power supply section 10. The power supply section 10 can turn on/off the light sources $10A_1$ to $10A_3$ independently.

Light beams from the light sources $10A_1$ to $10A_3$ are respectively focused by focusing lenses $11A_1$ to $11A_3$ to be incident on the end faces $A_1$ to $A_3$ of the light guide 103. Stop plates $20A_1$ to $20A_3$ are arranged between the end faces $A_1$ to $A_3$ of the light guide 103 and the focusing lenses $11A_1$ to $11A_3$. Each stop plate has a sectorial opening like the one shown in FIG. 11 and is supported to be rotatable about the optical axis. These stop plates $20A_1$ to $20A_3$ are driven by a driving section 20.

Light beams emerging from the end faces $B_1$ to $B_4$ of the light guide 103 reach detectors $30B_1$ to $30B_4$ via focusing lenses $12B_1$ to $12B_4$, respectively. Outputs from these detectors $30B_1$ to $30B_4$ are transmitted to a control section 30.

When the light guide 103 is to be actually inspected, the control section 30 controls the power supply section 10 to turn on only the light source $10A_1$. The control section 30 then controls the driving section 20 to rotate only the stop plate $20A_1$. With this operation, light exhibiting a nonuniform light amount distribution is incident on the end face $A_1$ of the light guide 103. At this time, the control section 30 receives outputs from the detectors $30B_1$ to $30B_4$ and stores the resultant data in an internal memory.

Subsequently, the control section 30 controls the power supply section 10 to turn on only the light source $10A_2$, and also controls the driving section 20 to rotate only the stop plate $20A_2$. With this operation, light exhibiting a nonuniform light amount distribution is incident on the end face $A_2$. At this time, the control section 30 receives outputs from the detectors $30B_1$ to $30B_4$ and stores the resultant data in the internal memory.

The control section 30 then controls the power supply section 10 to turn on only the light source $10A_3$, and also controls the driving section 20 to rotate only the stop plate $20A_3$. With this operation, light exhibiting a nonuniform light amount distribution is incident on the end face $A_3$. At this time, the control section 30 receives outputs from the detectors $30B_1$ to $30B_4$ and stores the resultant data in the internal memory.

If the light amounts of light reaching the detectors $30B_1$ to $30B_4$ are constant in either case, i.e., the outputs from the detectors $30B_1$ to $30B_4$ are constant although any light source is turned on, it can be considered that the light guide 103 has perfect random characteristics.

Assume that the light guide 103 whose random characteristics are confirmed by the above inspection is applied to the illumination optical apparatus of the first embodiment. In this case, even if one of light sources decreases in output, the influence of variations in light amount at the exit ends $B_1$ to $B_4$ of the light guide 103 can be reduced. In addition, even if light incident on the incident ends $A_1$ to $A_3$ of the light guide 103 exhibit a nonuniform light amount distribution, a light amount distribution at the exit ends $B_1$ to $B_4$ becomes almost uniform.

Second Embodiment

A scanning exposure apparatus using an illumination optical apparatus like the one described above will be described next.

Figure 12:
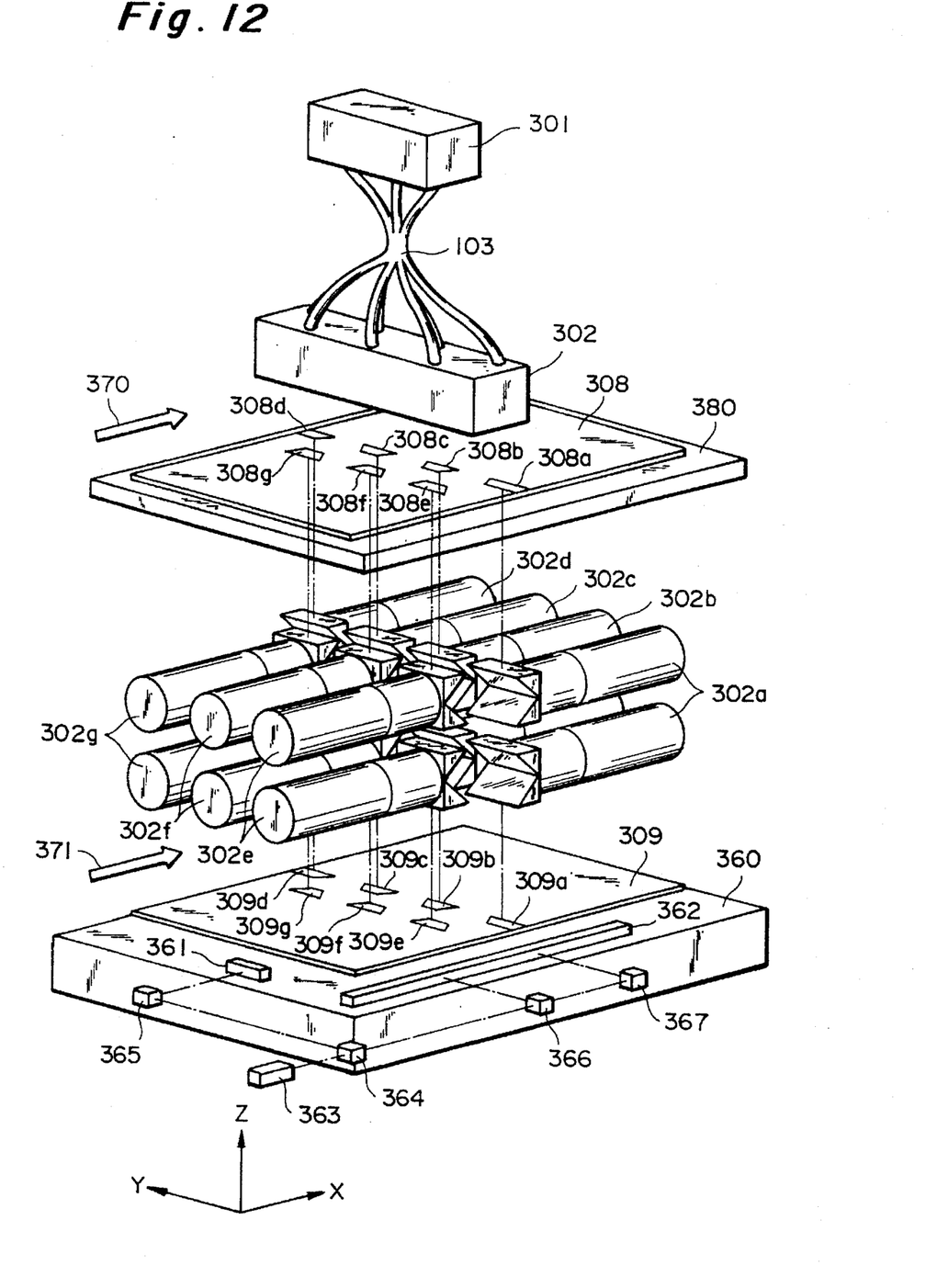
FIG. 12 is a perspective view showing the arrangement of the main part of a scanning exposure apparatus according to the second embodiment of the present invention.

FIG. 12 is a perspective view showing the arrangement of the main part of this scanning exposure apparatus.

First of all, light beams from an light source unit 301 incorporating a plurality of (three in FIG. 12) light sources and elliptical mirrors are incident on the incident ends of a light guide 103. This light guide 103 has three incident ends and seven exit ends. The light beams from the light source unit 301 are divided into equal seven light beams by the light guide 103. The light beams are then incident on an optical unit 302. The optical unit 302 incorporates seven optical systems each shown in FIG. 5. An illumination optical apparatus is constituted by the light source unit 301, the light guide 103, and the optical unit 302.

Light beams emerging from the optical unit 302 reach a mask 308 placed on a mask stage 380 to uniformly illuminate a plurality of (seven in FIG. 12) illumination areas 308a to 308g in a superposed state. Light beams from the illumination areas 308a to 308g pass through a plurality of (seven in FIG. 12) projection optical systems 302a to 302g and reach a plurality of (seven in FIG. 12) exposure areas 309a to 309g on a photosensitive substrate 309. The projection optical systems 302a to 302g respectively make the illumination areas 308a to 308g conjugate to the exposure areas 309a to 309g. As the projection optical systems 302a to 302g, Dyson or Offner type optical systems may be used. The photosensitive substrate 309 is placed on a substrate stage 360. The position of the substrate stage 360 is measured by interferometers 361 to 367.

While patterns on the mask 308 are projected on the substrate 309 with light beams from the illumination optical apparatus in the above-described manner, the mask 308 and the substrate 309 are moved in the same direction as indicated by arrows 370 and 371 at the same speed. With this operation, the patterns in the illumination areas 308a to 308g can be respectively transferred onto the exposure areas 309a to 309g.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No.170087/1994 filed on Jun. 29, 1994 is hereby incorporated by reference.

What is claimed is:

1. An illumination apparatus for illuminating a mask with a plurality of illumination regions, comprising:

a plurality of light sources;

a plurality of light correcting optical system equal in number to said light source;

a plurality of optical fibers bundled together, the incident ends of the plural bundled fiber being equal in number to said plural light source and the exit ends of the plural bundled fiber being equal in number to said illumination regions; and a plural illumination optical system equal in number to the exit ends, wherein lights from said plural light source being guided to said incident ends of said plural optical fibers through said plural light collecting optical system respectively and lights emitting from said exit ends of said plural optical fiber reaching to said mask throughout said plural illumination optical system respectively and the amount of light reaching each of the plural illumination regions is substantially equal to among them respectively.

2. An apparatus according to claim 1, wherein one end of each of the optical fibers arranged at the incident ends of said light guide randomly corresponds to the other end of each of the optical fibers arranged at the exit ends of said light guide.

3. An apparatus according to claim 1, wherein the optical fibers at the respective exit ends of said light guide are equal in number.

4. An apparatus according to claim 1, wherein a cross-sectional shape of each of the incident ends of said light guide in a direction perpendicular to an optical axis direction of the optical fiber is substantially similar to a shape of each of the light source images formed by said focusing optical system.

5. An apparatus according to claim 4, wherein each of the light source images formed by said focusing optical system has a substantially circular shape, and the cross-sectional shape of each of the incident ends of said light guide in the direction perpendicular to the optical axis direction of the optical fiber is substantially circular.

6. An apparatus according to claim 1, wherein a cross-sectional shape of each of the exit ends of said light guide in a direction perpendicular to an optical axis direction of the optical fiber is substantially similar to a shape of each of the illumination areas.

7. An apparatus according to claim 6, wherein each of the illumination areas has a substantially rectangular shape, and the cross-sectional shape of each of the exit ends of said light guide in the direction perpendicular to the optical axis direction of the optical fiber is substantially rectangular.

8. An apparatus according to claim 1, wherein said illumination optical system arranged between the exit ends of said light guide and the illumination areas comprises:

a collimation lens for collimating a light beam from a corresponding one of the exit ends;

a multiple light source image forming optical system for forming a plurality of light source images on the basis of a parallel light beam from said collimation lens; and a condenser lens for guiding light beams from a plurality of light source images formed by said multiple light source image forming optical system to a corresponding one of the illumination areas.

9. An apparatus according to claim 8, wherein said multiple light source image forming optical system comprises a plurality of lens elements each having a rectangular cross-section substantially similar to each of the illumination areas, said plurality of lens elements being arranged to make a cross-sectional shape of said multiple light source image forming optical system substantially circular or square.

10. A scanning exposure apparatus for illuminating a plurality of illumination areas on a mask and transferring a pattern formed on the mask onto a photosensitive substrate, comprising:

a plurality of light sources;

a focusing optical system for focusing light beams from said light sources to form light source images equal in number to said light sources;

a light guide having a plurality of optical fibers bundled together, said optical fibers being bundled such that said light guide has incident ends equal in number to said light sources and exit ends equal in number to the illumination areas, the incident ends being arranged at the respective light source images formed by said focusing optical system, and said light guide guiding light beams incident on the incident ends to the exit ends;

an illumination optical system for illuminating the respective illumination areas with the light beams emerging from the exit ends of said light guide;

a mask stage on which the mask is placed;

a substrate stage on which the substrate is placed; and a projection optical system for making a position on the mask placed on said mask stage conjugate to a position on the substrate placed on said substrate stage, wherein said light guide distributes light beams incident on the incident ends to make amounts of light beams emerging from the exit ends substantially equal to each other, and said mask stage moves in synchronism with said substrate stage.

11. An apparatus according to claim 10, wherein said projection optical system comprises optical systems equal in number to the illumination areas.

12. An illumination optical apparatus according to claim 1, wherein said light guide distributes light beams incident on the incident ends to make the amount of light beams emerging from the exit ends substantially equal to each other.

13. A method including the step of forming a pattern formed on a mask on a photosensitive substrate, said method comprising the steps of:

collecting lights from a plurality of light sources to form light images equal in number to said plural light source;

guiding light from said plural images to a plurality of optical fibers bundled together, said bundled fiber having incident ends equal in number to said light sources and exit ends equal in number to a predetermined number of illumination regions;

guiding lights from said exit ends to a plurality of illumination optical system equal in number to said plural ends respectively;

illuminating said mask with said plural illumination regions which are formed by lights from said plural illumination optical system;

forming an image of said mask by a plurality of light projection optical system equal in number to said illumination regions; and moving said mask and said photosensitive substrate, whereby giving substantially equal amount of light to each illumination region.

* * * * *